Nov. 13, 1962 A. H. CRYSTAL 3,064,180

CLOSED LOOP RESOLVER SWEEP CIRCUIT

Filed June 27, 1961

INVENTOR.
ALFRED H. CRYSTAL

BY

H. H. Losche

ATTORNEYS

United States Patent Office 3,064,180

Patented Nov. 13, 1962

3,064,180
CLOSED LOOP RESOLVER SWEEP CIRCUIT

Alfred H. Crystal, Howard Beach, N.Y., assignor, by mesne assignments, to the United States of America as represented by the Secretary of the Navy Filed June 27, 1961, Ser. No. 120,147
9 Claims. (Cl. 323—48)

This invention relates to the generation of sweep voltages to drive a resolver circuit for the production of sine and cosine resolver signals for the deflection circuits of a plan position indicator (PPI), or the like, and more particularly this invention relates to a closed feedback loop resolver circuit utilizing a single amplifier to produce the functions of developing a sweep voltage and of driving the resolver stator winding for the development of the sine and cosine resolver signals.

In prior known and presently used resolver sweep circuits of this type the sweep voltage is developed by the combination of a charging and discharging circuit and a sweep voltage amplifier, the output thereof being passed to a driver amplifier for driving the output current in the stator winding impedance circuit of a resolver. In this known device a separate amplifier with 100% feedback is required for the sweep generator and a second amplifier with feedback taken from one of the resolver windings is required for the resolver drive. If one of the amplifiers could be eliminated without eliminating the function thereof, considerable saving could be realized in the space and weight requirements of the resolver sweep circuit as well as the advantage of simplification of the resolver sweep circuit.

The driver amplifier and the sweep generator amplifier have been combined, thus eliminating one full amplifier. In the original circuit, the sweep generator comprised four amplifier stages and the resolver driver was made up of three amplifier stages for a ottal of seven stages. The invention in this embodiment simplifies it to a total of four stages. Depending on the strictness of requirements for sweep linearity, it could be less or possibly more stages. Sweep voltages are developed in a charging and discharging network coupled to the first grid input of the differential amplifier and the compensator winding of the resolver is coupled through a clamping network to the second grid of the differential amplifier as well as through a capacitor and resistor in series to the first grid of the differential amplifier to produce bootstrap amplification of the sweep voltage. The clamping network in the feedback circuit clamps the feedback voltage signals to the same voltage reference as the charging and discharging circuit in order that both grids of the differential amplifier will receive substantially the same signal starting from the same reference level. By this circuit arrangement the single three-stage amplifier will produce the functions of the sweep amplifier and the driver amplifier in the prior known devices. It is therefore a general object of this invention to provide a closed loop compensated resolver sweep circuit having a single amplifier to perform the functions of amplifying the sweep voltage and, at the same time, of driving the stator winding impedance circuit of the compensated resolver.

These and other objects and the attendant advantages will become more apparent to those skilled in the art as the description proceeds, when taken into consideration along with the drawing illustrating the preferred form of the invention, in which.

Figure 1:
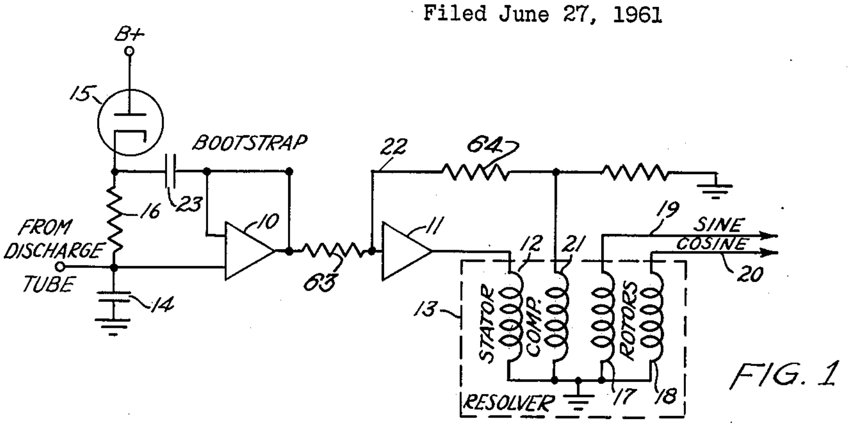
FIGURE 1 illustrates in block circuit diagram a well-known, presently used resolver sweep circuit.

Refering more particularly to FIGURE 1, a block circuit diagram is shown of a well-known and useful resolver sweep circuit in which a sweep voltage amplifier 10 and a resolver driver amplifier 11 are used in series to develop the proper sweep voltages on the stator winding 12 of a compensated resolver 13. Sweep voltages are developed across a charging capacitor 14 connected between the input of the sweep voltage amplifier 10 and a fixed or zero potential such as ground. The upper plate of the capacitor 14 is chargeable from a B+ source through a diode 15 and a resistor 16. This upper plate is likewise coupled to a discharge tube or other device for grounding or discharging the capacitor 14 such that when the discharge circuit is open the capacitor 14 will develop a sweep voltage by charging to the B+ voltage in accordance with the charging time established by the resistance 16. The sweep voltage on the output of the amplifier 10 is applied to three places: (A) to the other input of amplifier 10, (B) through a capacitor 23 to the junction of diode 15 and resistor 16 and (C) through resistor 63 and amplifier 11 to the stator winding of resolver 13. The output of amplifier 10 is fed back to the input of amplifier 10 to produce a gain of +1 or unity. Capacitor 23 prevents the direct current B+ voltage from being applied to the output of amplifier 10, yet allows the output sweep voltage of amplifier 10 to be fed back to the diode 15 and resistor 16 to produce a bootstrap sweep generation. These techniques are well understood by those skilled in the art. The resolver driver amplifier 11 applies the output voltage from amplifier 10 across the stator winding 12 of the resolver. This voltage is induced via the magnetic path in the resolver on compensator winding 21 and resistor 64. The voltage developed across resistor 64 is fed back to the input of amplifier 11. Rotor windings 17 and 18 in the resolver are fixed in angular position with respect to each other, but not with respect to the stator and compensator. Voltages on the windings 17 and 18 of the rotor will be proportional to the sine and cosine of their angle with respect to the stator winding 12 and will be referred to hereinafter as the sine and cosine resolver signals which will be conducted over the outputs 19 and 20, as is well understood by those skilled in the resolver art.

Figures 2, 3:
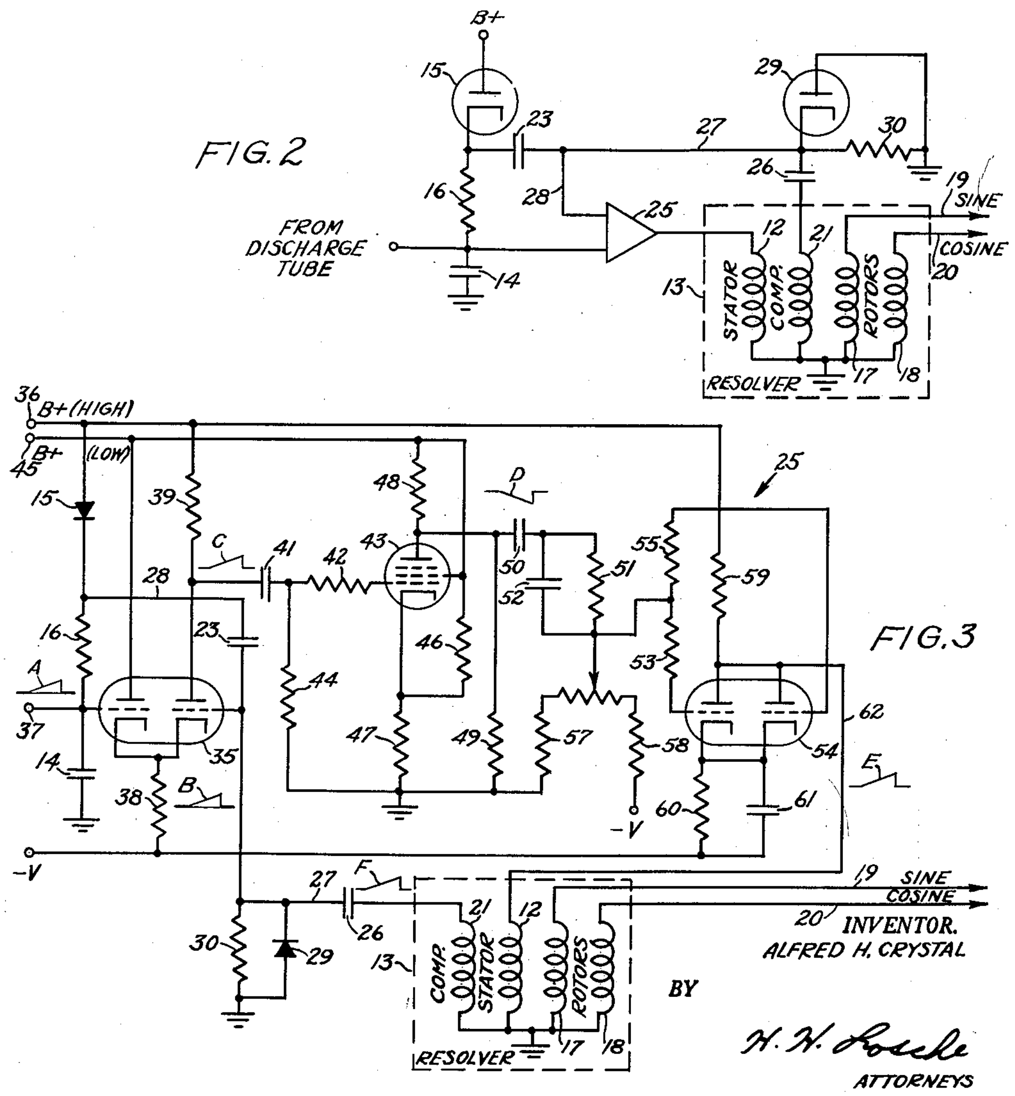
FIGURE 2 illustrates in block circuit diagram a closed loop resolver sweep circuit utilizing a single amplifier constituting the present invention.
FIGURE 3 illustrates the invention of FIGURE 2 with the single amplifier shown in circuit schematic form.

Referring more particularly to FIGURE 2, illustrating in block circuit diagram the present invention and showing like parts by like reference numerals with that of FIGURE 1, a sweep voltage is developed across the capacitor 14 in like manner as described in FIGURE 1. This sweep voltage is applied to an amplifier 25 which develops both the sweep and the driving power for the stator winding 12 of the compensated resolver 13. The compensator winding 21 is coupled through the capacitor 26 to feedback conductors 27 and 28 to the amplifier 25. The feedback circuit 26, 27, 28 has a clamping network coupled thereto consisting of the diode 29 and the resistance 30 coupled in parallel to a fixed or zero voltage such as ground as described for FIGURE 2. The diode 29 is oriented with the cathode thereof coupled to the feedback circuit 26, 27, 28 and the anode thereof coupled to the fixed potential to clamp any negative voltage swings generated in the compensator winding 21 at zero or ground potential which is the same potential used for a reference of the charging capacitor 14. It is to be understood that, while this invention is illustrated as having the reference potential for the charging capacitor 14 and for the clamping network 29 and 30 at zero or ground potential, this reference potential could be at some other voltage level, positive or negative, as desired. The amplifier 25 is therefore performing the functions and obtaining the results formerly obtained by two amplifiers to develop the sine and cosin resolver signals on the outputs 19 and 20 for a PPI, or other device to be driven by this circuit.

To better understand the capabilities of the circuit disclosed in FIGURE 2 the circuit schematic diagram illustrates in FIGURE 3 the amplifier 25 in combination with the charging and discharging circuit and the compensated resolver. Like parts illustrated in FIGURES 1 and 2 bear like reference characters in FIGURE 3. A sweep voltage, as shown by A on the first input grid of a differential amplifier 35, is developed across the charging capacitor 14 from a high B+ voltage applied at 36 through the diode 15. The terminal 37 to the first grid of the differential amplifier 35 is adapted to be coupled to some switching discharge tube or other switching means to periodically discharge the charging capacitor 14. As capacitor 14 charges from the B+ 36 supply, the sweep voltage A will be developed and cut off at the point where the discharge tube, or the device connected to the terminal 37, again discharges the capacitor 14. For the purpose of example herein, let it be assumed that the sweep voltage A is of positive polarity and, as this sweep voltage progresses, conduction in the left half of the differential amplifier tube 35 will increase to raise the voltage of the commonly coupled cathodes coupled through a cathode resistor 38 to a negative voltage source. A feedback voltage sweep, as illustrated by the waveform B, is applied to the second grid of the differential amplifier tube 35, in a manner soon to be described, to develop the positive sweep voltage C across an anode resistor 39. The feedback sweep voltage B is also passed through the capacitor 23 and the resistance 16 to the first grid of the differential amplifier tube 35 to produce bootstrap amplification of the output sweep voltage C. Capacitor 23 blocks the direct current B+ voltage from 36 to the feedback circuit 27. The output sweep voltage C is coupled through a coupling capacitor 41 and a resistance 42 to the control grid of a pentode amplifier tube 43 constituting the second stage of amplification in the amplifier 25. The control grid of the pentode 43 is biased by the resistor 44, the screen grid is coupled to a low B+ voltage from 45, and the cathode is biased from the voltage divider constituting the resistances 46 and 47 coupled between the low B+ voltage source 45 and ground or zero potential. The anode of the pentode 43 is coupled through an anode resistor 48 and a resistance 49 to ground. The pentode amplifier inverts the sweep voltages applied to the control grid thereof to develop negative going sweep voltages D across the anode resistance 48 which negative going sweep voltages D are applied through a coupling capacitor 50 and a parallel resistance-capacitance network 51 and 52 in series with resistance 53 to the first grid of a double triode amplifier tube 54. This negative going sweep voltage D is likewise applied through a resistance 55 to the second grid of the double triode tube 54. The resistances 53 and 55 serve as parasitic oscillation suppressors. Grid bias on these two grids is applied from a potentiometer 56 coupled in a voltage dividing network having resistances 57 and 58 between ground or zero voltage and a negative direct current voltage. The anodes of the double triode tube are coupled in common to an anode voltage which is applied through an anode load resistor 59 and the cathodes of this tube are coupled in common, the common coupling of these cathodes being through a parallel resistance-capacitance network 60, 61 to a low negative voltage. The anode output of double triode amplifier tube 54 inverts each negative sweep voltage D to produce the positive sweep voltage E which is applied by way of conductor means 62 to the stator winding 12 of the revolver 13. The double triode 54 having both triode sections coupled in parallel provides a high driving current output sufficient to drive the resolver although a single triode or pentode tube having the required high current capabilities could be used. The stator and compensator windings in resolver 13 are similarly polarized to induce in the compensator winding 21 a positive going sweep voltage as shown by the waveform F in the feedback circuit 26, 27, 28. While the sweep voltage E normally loses its direct current component at the compensator winding, it is necessary that the outgoing feedback voltage F developed by the compensator winding be referred to the same voltage level as the charging capacitor 14 for application to the grids of the differential amplifier tube 35. The second grid of the differential amplifier tube 35 being coupled to ground through the resistance 30 starts this grid at the same voltage level as the first grid of this differential amplifier tube. Any tendency of voltage swings in the negative direction will be clamped at zero by the diode 29. The positive going voltage sweep signals as shown by F become the positive going sweep signals B originating from a zero potential in the same manner as the sweep voltage A. The application of the sweep voltages A and B to the grids of the differential amplifier 35 to produce the amplified sweep voltage C results in the output conductor 62 without inversion as the sweep voltage E to the stator winding 12 of the resolver 13. While a triode tube may be used in place of the double triode tube 54 as the third stage of amplification it is preferable to use the double triode in order to produce enough current to drive resolver 13. The gain of the entire amplifier 25 with feedback, including the three stages of amplification, approach unity. The amplified output at 62 will be sufficient to drive the resolver 13 whereby the sine and cosine resolver signals may be developed in the rotors 17 and 18 for conduction on the output leads 19 and 20, respectively.

In the operation of the device let it be assumed for the purpose of example, but in no way for the purpose of limitation, that the high B+ voltage applied at 36 is 300 volts and the low B+ voltage applied at 45 is 150 volts. The low negative voltages applied to the cathodes of the differential amplifier 35 and the cathodes of the twin amplifier tube 54 may be about −300 volts and the biasing voltage coupled to the resistance 58 may be −150 volts. The sweep voltage A developed upwards from zero potential and the feedback sweep voltage B developed upwards from the zero potential are applied to the grids of the differential amplifier 35 to produce the output sweep voltage C. The output sweep voltage C will be developed since both the cathodes and second grid voltage of the differential amplifier 35 are rising together. Pentode amplifier 43 inverts the sweep voltage C to produce negative going sweep voltage D which is applied to the tube grids of the twin triode tube 54. The sweep voltage E is developed across the anode resistor 59 from the high B+ voltage source producing a driving sweep voltage in the stator winding 12 of the resolver 13. At the time that a discharge tube or discharge circuit connects the terminal 37 to ground the sweep voltage will be abruptly cut off and returned to the zero voltage, and any negative swings included as a result in the compensator winding 21 as shown in the sweep voltage F will be clamped at zero by the diode 29. The amplifier 25 therefore operates at a bootstrap for the developed sweep voltages A and at the same time as a driver amplifier by the output sweep voltages E in the stator winding 12. Sine and cosine resolver signals are thereby developed in the resolver to drive a plan position indicator, or the like, in the same manner as similar circuits utilizing both sweep and driver amplifier circuits.

While many modifications and changes may be made in the constructional arrangement and features of this invention, it being understood that voltages may be applied other than those given in the example and that the circuit may be readily adapted for use of opposite polarity, I desire to be limited only by the spirit and scope of the appended claims.

I claim:

1. A closed loop resolver sweep circuit comprising: a bootstrap amplifier circuit having a differential amplifier therein, one input to said differential amplifier being coupled to a charging and discharging means; a compensated resolver having the stator winding thereof coupled to the output of said bootstrap amplifier circuit and the compensator winding thereof coupled to the other input of said differential amplifier; and a clamping circuit coupled to said coupling of said compensator winding and said differential amplifier inputs to clamp the voltage equal to the discharge voltage of said charging and discharging means whereby the bootstrap amplifier functions as the sweep generator and driver amplified for the resolver.

2. A closed loop resolver sweep circuit comprising: a bootstrap amplifier circuit having a differential amplifier therein with two inputs, one input being coupled to a charging and discharging network to produce voltage waves thereon; a compensated resolver having the stator winding thereof coupled to the output of said bootstrap amplifier circuit and the compensating winding thereof coupled to the two inputs of said differential amplifier; and a clamping network coupled to the coupling of said compensating winding and said differential amplifier for clamping the voltage output of said compensating winding to the same voltage reference as the charging and discharging network whereby the bootstrap amplifier functions as the sweep voltage amplifier and the driver amplifier for the resolver.

3. A closed loop resolver sweep circuit as set forth in claim 2 wherein said charging and discharging network includes a capacitor coupled between said one input of said differential amplifier and a fixed potential, a voltage supply coupled to said one input, and a means coupled to said one input adaptable to periodically discharge said capacitor.

4. A closed loop resolver sweep circuit as set forth in claim 3 wherein said clamping network includes a diode and a resistor in parallel to said fixed potential to establish the reference voltage at said fixed potential.

5. A closed loop resolver sweep circuit as set forth in claim 4 wherein said bootstrap amplifier includes two stages of gain in addition to said differential amplifier.

6. A closed loop resolver sweep circuit comprising: a bootstrap amplifier circuit including a differential amplifier tube, having two grid inputs, and additional stages of gain constructed and arranged to amplify a signal applied to one of the grids of said differential amplifier on an output of the final stage in the same polarity, said one input being coupled to a charging and discharging network; a compensated resolver having its stator winding coupled to said final stage output and its compensator winding coupled to the other grid of said differential amplifier for inducing amplifier output signals from said stator winding into said compensator winding in the same polarity; and a clamping network coupled in said coupling of said compensator winding and said other grid for clamping the voltage output of said compensator winding to the same voltage reference as the charging and discharging network whereby the bootstrap amplifier in combination with said charging and discharging network functions as a sweep voltage amplifier and a driver amplifier for the resolver.

7. A closed loop resolver sweep circuit as set forth in claim 6 wherein said charging and discharging network and said clamping network are each referenced to a fixed potential whereby the signals applied to the two grids of said differential amplifier originate from the same fixed potential.

8. A closed loop resolver sweep circuit as set forth in claim 7 wherein said differential amplifier has the two grids coupled through a capacitor and a resistor in series to produce bootstrap amplification of signals developed in said charging and discharging network.

9. A closed loop resolver sweep circuit as set forth in claim 8 wherein said charging and discharging network is a capacitor coupled between said one grid and said fixed potential with a grid bias voltage applied, and said clamping network includes a capacitor in said coupling of said compensator winding and said other grid and a diode and resistor coupled in parallel between said other grid and said fixed potential, said diode being oriented to prevent signal voltage to exceed said fixed potential.

No references cited.